(12) United States Patent
Choy et al.

(10) Patent No.: US 9,972,780 B1
(45) Date of Patent: May 15, 2018

(54) METHODS FOR PREPARING A NIOX:ELECTRON ACCEPTOR NANOCOMPOSITE BASED FILM AND OPTOELECTRONIC DEVICES INCORPORATING THE SAME

(71) Applicant: The University of Hong Kong, Hong Kong (CN)

(72) Inventors: Wallace C. H. Choy, Shatin (HK); Jiaqi Cheng, Kennedy Town (HK)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 0 days. days.

(21) Appl. No.: 15/403,855

(22) Filed: Jan. 11, 2017

(51) Int. Cl.
| H01L 51/54 | (2006.01) |
| H01L 51/00 | (2006.01) |
| B05D 1/00 | (2006.01) |
| B05D 1/26 | (2006.01) |
| B05D 1/28 | (2006.01) |
| B05D 1/02 | (2006.01) |
| B05D 3/14 | (2006.01) |

(Continued)

(52) U.S. Cl.
CPC .......... *H01L 51/0007* (2013.01); *B05D 1/005* (2013.01); *B05D 1/02* (2013.01); *B05D 1/26* (2013.01); *B05D 1/28* (2013.01); *B05D 3/142* (2013.01); *B05D 3/145* (2013.01); *C01G 53/04* (2013.01); *H01L 51/42* (2013.01); *C01P 2002/85* (2013.01); *C01P 2004/04* (2013.01); *C01P 2006/40* (2013.01)

(58) Field of Classification Search
None
See application file for complete search history.

(56) References Cited

U.S. PATENT DOCUMENTS

2007/0181876 A1* 8/2007 Itai ..................... H01L 51/5088
257/40

OTHER PUBLICATIONS

C.-Z. Li, C.-Y. Chang, Y. Zang, H.-X. Ju, C.-C. Cbueh, P.-W. Liang, N. Cho, D. S. Ginger, A. K. Y. Jen, Suppressed Charge Recombination in Inverted Organic Photovoltaics via Enhanced Charge Extraction by Using a Conductive Fullerene Electron Transport Layer, Adv. Mater. 2014, 26, pp. 6262-6267.

(Continued)

*Primary Examiner* — Nathan T Leong
(74) *Attorney, Agent, or Firm* — Leason Ellis LLP (57) ABSTRACT

A $NiO_x$:electron acceptor nanocomposite based film is prepared by synthesizing $NiO_x$ nanoparticles (NPs) by a solvothermal synthesis treatment; dispersing the $NiO_x$ NPs and an electron acceptor into an alcohol solvent to form a $NiO_x$:electron acceptor solution; conducting an ultrasonic treatment on the $NiO_x$:electron acceptor solution; and solution-processing the $NiO_x$:electron acceptor solution onto a substrate to form a $NiO_x$:electron acceptor nanocomposite based film on the substrate. The film may be used to form an optoelectronic device such as solar cell, a light emitting diode, a laser, or a photodetector.

11 Claims, 6 Drawing Sheets

(51) Int. Cl.
H01L 51/42 (2006.01)
C01G 53/04 (2006.01)

(56) References Cited

OTHER PUBLICATIONS

Z. He, C. Zhong, X. Huang, W. Y. Wong, H. Wu, L. Chen, S. Su, Y. Cao, Simultaneous Enhancement of Open-Circuit Voltage, Short-Circuit Current Density, and Fill Factor in Polymer Solar Cells, Adv. Mater.: 2011, 23, pp. 4636-4643.
E. Voroshazi, I. Cardinaletti, G. Uytterhoeven, S. Li, M. Empl, T. Aemouts, B. P. Rand, Role of Electron-and Hole-Collecting Buffer Layers on the Stability of Inverted Polymer: Fullerene Photovoltaic Devices, IEEE J Photovolt. 2014, 4, pp. 265-270.
Z. Ym, J. Wei, Q. Zheng, Interfacial Materials for Organic Solar Cells: Recent Advances and Perspectives, Adv. Science 2016, 3, 1500362 (37 pages).
J.-Y. Jeng, M.W. Lin, Y.-J. Hsu, T.-C. Wen, T.-F. Guo, The Roles of Poly(Ethylene Oxide) Electrode Buffers in Effi cient Polymer Photovoltaics, Adv. Energy Mater. 2011, 1, pp. 1192-1198.
H.-L. Yip, A. K.-Y. Jen, Recent advances in solution-processed interfacial materials for efficient and stable polymer solar cells, Energy Environ. Sci. 2012, 5, 5994.
H. Ma, H.-L. Yip, F. Huang, A. K. Y. Jen, Interface Engineering for Organic Electronics, Adv. Funct. Mater. 2010, 20, pp. 1371-1388.
C.-Y. Li, Y.-N. Chou, J.-R. Syu, S.-N. Hsieh, T.-D. Tsai, C.-H. Wu, T.-F. Guo, W.-C. Hsu, Y.-J. Hsu, T.-C. Wen, Effect of annealing ZnO on the performance of inverted polymer light-emitting diodes based on SAM/ZnO as an electron injection layer, Org. Electron. 2011, 12, pp. 1477-1482.
L. Groenendaal, F. Jonas, D. Freitag, H. Pielartzik, J. R. Reynolds, Poly(3,4-ethylenedioxythiophene) and Its Derivatives: Past, Present, and Future, Adv. Mater. 2000, 12, pp. 481-493.
F. Xie, W. C.H. Choy, C. Wang, X. Li, S. Zhang, J. Hou, Low-Temperature Solution-Processed Hydrogen Molybdenum and Vanadium Bronzes for an Efficient Hole-Transport Layer in Organic Electronics, Adv. Mater. 2013, 25, pp. 2051-2055.
X. Li, W. C.H. Choy, F. Xie, S. Zhang, J. Hou, Room-temperature solution-processed molybdenum oxide as a hole transport layer with Ag nanoparticles for highly efficient inverted organic solar cells, J. Mater. Chem. A2013, 1, pp. 6614-6621.
S. Chen, J. R. Manders, S.-W. Tsang, F. So, Metal oxides for interface engineering in polymer solar cells, J. Mater. Chem. 2012, 22, pp. 24202-24212.
K. X. Steirer, J.P. Chesin, N. E. Widjonarko, J. J. Berry, A. Miedaner, D.S. Ginley, D. C. Olson, Solution deposited NiO thin-films as hole transport layers in organic photovoltaics, Org. Electron. 2010, 11, pp. 1414-1418.
A. Garcia, G. C. Welch, E. L. Ratcliff, D. S. Ginley, G. C. Bazan, D. C. Olson, Improvement of Interfacial Contacts for New Small-Molecule Bulk-Heterojunction Organic Photovoltaics, *Adv. Mata* 201, 224, pp. 5368-5373.
K. X. Steirer, P. F. Ndione, N. E. Widjonarko, M. T. Lloyd, J. Meyer, E. L. Ratcliff, A. Kahn, N. R. Armstrong, C. J. Curtis, D. S. Ginley, J. J. Berry, D. C. Olson, Enhanced Effi ciency in Plastic Solar Cells via Energy Matched Solution Processed NiO x Interlayers, Adv. Energy Mater. 2011, 1, pp. 813-820.
E. L. Ratcliff, J. Meyer, K. X. Steirer, A. Garcia, J. J. Berry, D. S. Ginley, D. C. Olson, A. Kahn, N. R. Armstrong, Evidence for near-Surface NiOOH Species in Solution-Processed NiOx Selective Interlayer Materials: Impact on Energetics and the Performance of Polymer Bulk Heterojunction Photovoltaics, Chem. Mater. 2011, 23, pp. 4988-5000.
Z. Zhai, X. Huang, M. Xu, J. Yuan, J. Peng, W. Ma, Greatly Reduced Processing Temperature for a Solution- Processed NiO x Buffer Layer in Polymer Solar Cells, Adv. Energy Mater. 2013, 3, pp. 1614-1622.
S. Bai, M. Cao, Y. Jin, X. Dai, X. Liang, Z. Ye, M. Li, J. Cheng, X. Xiao, Z. Wu, Z. Xia, B. Sun, E. Wang, Y. Mo, F. Gao, F. Zhang, Low-Temperature Combustion-Synthesized Nickel Oxide Thin Films as Hole-Transport Interlayers for Solution-Processed Optoelectronic Devices, Adv. Energy Mater. 2014, 4, pp. 1301460 (6 pages).
J. R. Manders, S.-W. Tsang, M. J. Hartel, T.-H. Lai, S. Chen, C. M. Amb, J. R. Reynolds, F. So, Solution-Processed Nickel Oxide Hole Transport Layers in High Effi ciency Polymer Photovoltaic Cells, Adv. Funct. Mater: 2013, 23, pp. 2993-3001.
K. Zilberberg, J. Meyer, T. Riedl, Solution processed metal-oxides for organic electronic devices, J. Mater: Chem. C 2013, 1, pp. 4796-4815.
J. Zhang, J. Wang, Y. Fu, B. Zhang, Z. Xie, Efficient and stable polymer solar cells with annealing-free solution-processible NiO nanoparticles as anode buffer layers, J. Mater. Chem. C 2014, 2, 8295.
F. Jiang, W. C.H. Choy, X. Li, D. Zhang, J. Cheng, Post-treatment-Free Solution-Processed Non-stoichiometric NiO x Nanoparticles for Effi cient Hole-Transport Layers of Organic Optoelectronic Devices, Adv. Mater. 2015, 27, pp. 2930-2937.
R. Søndergaard, M. Rosel, D. Angmo, T. T. Larsen-Olsen, F. C. Krebs, Roll-to-roll fabrication of polymer solar cells, Mater: Today 2012, 15, pp. 36-49.
M. Wang, D. Cai, Z. Yin, S.-C. Chen, C.-F. Du, Q. Zheng, Asymmetric-Indenothiophene-Based Copolymers for Bulk Heterojunction Solar Cells with 9.14% Efficiency, Adv. Mater. 2016, 28, pp. 3359-3365.
Y. Liu, J. Zhao, Z. Li, C. Mu, W. Ma, H. Hu, K. Jiang, H. Lin, H. Ade, H. Yan, Aggregation and morphology control enables multiple cases of high-efficiency polymer solar cells, Nat; Commun. 2014, 5, pp. 5293-6293.
L. Huo, J. Hou, S. Zhang, H.-Y. Chen, Y. Yang, A Polybenzo[1,2-b:4,5-b']dithiophene Derivative with Deep HOMO Level and Its Application in High-Performance Polymer Solar Cells, Angew. Chem. Int. Edit. 2010, 49, pp. 1500-1503.
P.-L. T. Boudreault, A. Najari, M. Leclerc, Processable Low-Bandgap Polymers for Photovoltaic Applications, Chem. Mater. 2010, 23, pp. 456-469.
T. Ma, K. Jiang, S. Chen, H. Hu, H. Lin, z. Li, J. Zhao, Y. Liu, Y.-M. Chang, C.-C. Hsiao, H. Yan, Efficient Low-Bandgap Polymer Solar Cells with High Open-Circuit Voltage and Good Stability, Adv. Energy Mater. 2015, 5, 1501282 (6 pages).
S. Zhang, L. Ye, J. Hou, Breaking the 10% Efficiency Barrier in Organic Photovoltaics: Morphology and Device Optimization of Well-Known PBDTTT Polymers, Adv. Energy Mater. 2016, pp. 1502529 (20 pages).
R. Steim, F. R. Kogler, C. J. Brabec, Interface materials for organic solar cells, J. Mater. Chem. 2010, 20, pp. 2499-2512.
Z. Hu, Z. Zhong, Y. Chen, C. Sun, F. Huang, J. Peng, J. Wang, Y. Cao, Energy-Level Alignment at the Organic/Electrode Interface in Organic Optoelectronic Devices, Adv. Funct. Mater: 2016, 26, pp. 129-136.
B. P. Rand, D. P. Burk, S. R. Forrest, Offset energies at organic semiconductor heterojunctions and their influence on the open-circuit voltage of thin-film solar cells, Phys. Rev. B 2007, 75, pp. 115327-1-115327-11.
L. Dou, J. You, Z. Hong, Z. Xu, G. Li, R. A. Street, Y. Yang, 25th Anniversary Article: A Decade of Organic/Polymeric Photovoltaic Research, Adv. Mater: 2013, 25, 6642.
K.-H. Yun. G. L. Whiting, C. E. Murphy, J. J.M. Halls, J. H. Burroughes, R.H. Friend, J.-S. Kim, Controlling Electrical Properties of Conjugated Polymers via a Solution-Based p-Type Doping, Adv. Mater: 2008, 20, pp. 3319-3324.
Y. Zhang, H. Zhou, J. Seifter, L. Ymg, A. Mik.bailovsky, A. J. Reeger, G. C. Bazan, T.-Q. Nguyen, Molecular Doping Enhances Photoconductivity in Polymer Bulk Heterojunction Solar Cells, Adv. Mater. 2013, 25, pp. 7038-7044.
Y. Zhang, B. de Boer, P. W. M. Blom, Controllable Molecular Doping and Charge Transport in Solution-Processed Polymer Semi-conducting Layers, Adv. Funct. Mater. 2009, 19, pp. 1901-1905.
Y. Zhang, P. W. M. Blom, Enhancement of the hole injection into regioregular poly,,3-hexylthiophene by molecular doping, Appl. Phys. Lett. 2010, 97, 083303 (3 pages).

(56) References Cited

OTHER PUBLICATIONS

Q. Wang, C. Bi, J. Huang, Doped hole transportlayerforefficiency enhancementinplanarheterojunction organolead trihalide perovskite solar cells, Nano Energy 2015, 15, pp. 275-280.

z. Wang, P. K. Nayak, J. A. Caraveo-Frescas, H. N. Alshareef, Recent Developments in p-Type Oxide Semiconductor Materials and Devices, Adv. Mater: 2016, 28, pp. 3831-3892.

M. Niederberger, Nonaqueous Sol-Gel Routes to Metal Oxide Nanoparticles, Acc. Chem. Res. 2007, 40, pp. 793-800.

M. Niederberger, G. Garnweitner, Organic Reaction Pathways in the Nonaqueous Synthesis ofMet al Oxide Nanoparticles, Chem Eur.: J. 2006, 12, pp. 7282-7302.

E. R. Beach, K. Shqau, S. E. Brown, S. J. Rozeveld, P.A. Morris, Solvothermal synthesis of crystalline nickel oxide nanoparticles, Mater. Chem. Phys. 2009, 115, pp. 371-377.

K. Fominykh, J.M. Feckl, J. Sick.linger, M. Doblinger, S. Backlein, J. Ziegler, L. Peter, J. Rathousky, E.W. Scheidt, T. Bein, H. Faber, Ultrasmall Dispersible Crystalline Nickel Oxide Nanoparticles as High-Performance Catalysts for Electrochemical Water Splitting, Adv. Funct. Mater: 2014, 24, pp. 1-7.

K. S. Kim, N. Winograd, X-ray Photoelectron Spectroscopic Studies of Nickel-Oxygen Surfaces Using Oxygen and Argon Ion-Bombardment, Surf Sci. 1974, 43, pp. 625-643.

B. Sasi, K. G. Gopchandran, Nanostructured mesoporous nickel oxide thin films, Nanotechnology 2007, 18, 115613 (9 pages).

U. St, C. Scharfschwerdt, M. Neumann, G. Illing, H.J. Freund, The influence of defects on the Ni 2p and O 1s XPS of NiO, J Phys.: Condens. Matter 1992, 4, pp. 7973-7978.

J. Cheng, F. Xie, Y. Liu, E. Wei, X. Li, Y. Yang, W. C. Choy, Efficient hole transport layers with widely tunable work function for deep HOMO level organic solar cells, J. Mater: Chem. A 2015, 3, pp. 23955-23963.

O. J. Sandberg, M. Nyman, R. Österbacka, Effect of Contacts in Organic Bulk Heterojunction Solar Cells, Phys. Rev. Applied 2014, 1, 024003 (15 pages).

A. Hadipour, D. Cheyns, P. Heremans, B. P. Rand., Electrode Considerations for the Optical Enhancement of Organic Bulk Heterojunction Solar Cells, Adv. Energy Mater. 2011, 1, pp. 930-935.

S. B. Dkhil, D. Duché, M. Gaceur, A. K. Thakur, F. B. Aboura, L. Escoubas, J.-J. Simon, A. Guerrero, J. Bisquert, G. Garcia-Belmonte, Q. Bao, M. Fahlman, C. Videlot-Ackermann, O. Margeat, J. Ackermann, Interplay of Optical, Morphological, and Electronic Effects of ZnO Optical Spacers in Highly Efficient Polymer Solar Cells, Adv. Energy Mater. 2014, 4, 1400805.

J. Liu, X. Li, S. Zhang, X. Ren, J. Cheng, L. Zhu, D. Zhang, L. Huo, J. Hou, W. C. Choy, Synergic Effects of Randomly Aligned SWCNT Mesh and Self-Assembled Molecule Layer for High-Performance, Low-Bandgap, Polymer Solar Cells with Fast Charge Extraction, Adv. Mater: lnterf 2015, 2, 1500324 (9 pages).

W. J.E. Beek, M. M. Wienk, M. Kemerink, X. Yang, R. A. J. Janssen, Hybrid Zinc Oxide Conjugated Polymer Bulk Heterojunction Solar Cells, J Phys. Chem. B 2005, 109, pp. 9505-9516.

\* cited by examiner

METHODS FOR PREPARING A NIOX:ELECTRON ACCEPTOR NANOCOMPOSITE BASED FILM AND OPTOELECTRONIC DEVICES INCORPORATING THE SAME

FIELD OF THE INVENTION

The present invention generally relates to optoelectronics, and more particularly to methods for preparing a NiOx:electron acceptor nanocomposite based film and optoelectronic devices incorporating the same.

BACKGROUND OF THE INVENTION

During the formation of films, such as a hole transporting layer (HTL) in normal optoelectronic devices, the pretreatment of a transparent conductive substrate and the post-treatment of HTLs are always necessary in order to realize good surface energy matching and qualified properties. Take the most commonly used HTL material, for example water-dissolved poly(3,4-ethylenedioxythiophene):poly(styrenesulfonic acid) (PEDOT:PSS), it faces the problem of wetting a pristine substrate. As a result, the underlying substrate needs to be ultraviolet-ozone (UVO) or oxygen-plasma treated to realize a good surface energy match with a water-based PEDOT:PSS solution. Also, PEDOT:PSS needs thermal annealing after the film formation to remove the residual water. Otherwise, it will still re-absorb water if the samples are not used immediately.

Meanwhile, various kinds of organic donor materials have emerged in the past several years, and they typically have different highest occupied molecular orbital (HOMO) values. The most studied donor polymer, poly(3-hexylthiophene) (P3HT), has a HOMO energy level of around 5.00 eV. As another example, conjugated polymers based on the backbone of alternating benzo[1,2-b;4,5-b']dithiophene (BDT) and thieno[3,4-b]thiophene (TT) building units have HOMO values that vary from 5.07 eV (PBDTTT-C) to 5.33 eV (PBDT-TS1). As the alignment of work function (WF) of HTL with the donor's HOMO is a very important issue to prevent energy loss at the interface, developing WF tunable films (e.g. acting as HTL) becomes desirable.

New methods and apparatus that assist in advancing technological needs and industrial applications are desirable.

SUMMARY OF THE INVENTION

Embodiments of this invention are directed to a method for preparing a NiOx:electron acceptor nanocomposite based film. An exemplary method includes: synthesizing NiOx nanoparticles (NPs) by a solvothermal synthesis treatment; dispersing the NiOx NPs and an electron acceptor into an alcohol solvent to form a NiOx:electron acceptor solution; conducting an ultrasonic treatment on the NiOx:electron acceptor solution; and solution-processing the NiOx:electron acceptor solution onto a substrate to form a NiOx:electron acceptor nanocomposite based film on the substrate.

By way of example, the NiOx is a composite consisting essentially of NiO and other species selected from nickelic oxide (Ni2O3), nickel oxide hydroxide (NiOOH), and nickel hydroxide Ni(OH)2.

By way of example, the electron acceptor has a general chemical formula of Fx-TCNQ, wherein x=0, 1, 2, 3, 4. In particular, the electron acceptor may be selected from a group consisting of 7,7,8,8-tetracyanoquinodimethane (TCNQ), 2-fluoro-7,7,8,8-tetracyanoquinodimethane (F1-TCNQ), 2,3-difluoro-7,7,8,8-tetracyanoquinodimethane (2,3-F2-TCNQ), 2,5-difluoro-7,7,8,8-tetracyanoquinodimethane (2,5-F2-TCNQ), 2,6-difluoro-7,7,8,8-tetracyanoquinodimethane (2,6-F2-TCNQ), 2,3,5-trifluoro-7,7,8,8-tetracyanoquinodimethane (2,3,5-F3-TCNQ), 2,3,6-difluoro-7,7,8,8-tetracyanoquinodimethane (2,3,6-F3-TCNQ), 2,5,6-difluoro-7,7,8,8-tetracyanoquinodimethane (2,5,6-F3-TCNQ), 3,5,6-difluoro-7,7,8,8-tetracyanoquinodimethane (3,5,6-F3-TCNQ), and 2,3,5,6-tetrafluoro-7,7,8,8-tetracyanoquinodimethane (F4-TCNQ).

By way of example, the alcohol solvent in an illustrative embodiment may have a general chemical formula of CnH2n+1OH, wherein n is a positive integer, and in particular, the alcohol solvent may be selected from a group consisting of methanol (CH3OH), ethanol (C2H5OH), propanol (C3H7OH), and butanol (C4H9OH).

By way of example, the substrate is glass, silicon, Indium tin oxide (ITO) coated glass, fluorine-doped tin oxide (FTO) coated glass, or any of them coated with semiconductor materials. In an exemplary embodiment the substrate is ITO coated polyethylene terephthalate (PET), ITO coated polyethylene-naphthalate (PEN), ITO coated polyimide (PI), FTO coated PET, FTO coated PEN, and FTO coated PI, or any of them coated with semiconductor materials.

By way of example, the film is solution-processed onto the substrate without a pre-treatment of the substrate and without a post-treatment of the film. In this regard the pre-treatment is ultraviolet-ozone (UVO) treatment or oxygen-plasma treatment. The post-treatment is UVO treatment, oxygen-plasma treatment, or annealing. Further, the solution-processing is one of casting spin-coating, doctor blading, ink jet printing, spray coating and roll-to-roll coating.

With some methods in accordance with exemplary embodiments, the concentration of the electron acceptor can be changed such that the work function of the NiOx:electron acceptor based film is tuned.

By way of example, an optoelectronic device is created wherein the optoelectronic device comprises a NiOx:electron acceptor based film and the film acts as a hole transport layer (HTL) to transport holes. Other examplary embodiments are discussed herein.

BRIEF DESCRIPTION OF THE DRAWINGS

The foregoing and other objects and advantages of the present invention will become more apparent when considered in connection with the following detailed description and appended drawings in which like designations denote like elements in the various views, and wherein.

DETAILED DESCRIPTION OF EXEMPLARY EMBODIMENTS

Figure 1:
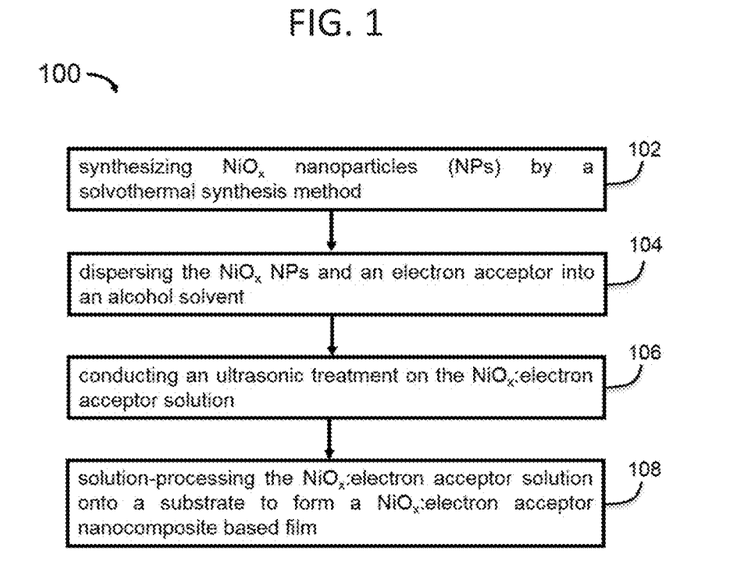
FIG. 1 shows the steps of preparing a $NiO_x$:electron acceptor nanocomposite based film according to the present invention.

The present invention relates to methods for preparing a NiOx:electron acceptor nanocomposite based film and optoelectronic devices incorporating the same. FIG. 1 shows the steps 100 required to prepare a NiOx:electron acceptor film in accordance with an exemplary embodiment of the present invention.

NiO$_x$ is a composite consisting essentially of NiO and other species selected from nickelic oxide (Ni$_2$O$_3$), nickel oxide hydroxide (NiOOH), and nickel hydroxide Ni(OH)$_2$. In an exemplary embodiment, NiO$_x$ nanoparticles (NPs) are synthesized by a solvothermal method at step 102. The NiO$_x$ NPs and an electron acceptor are dispersed into an alcohol solvent to form a NiO$_x$:electron acceptor solution at step 104. An ultrasonic treatment is conducted or performed on the NiO$_x$:electron acceptor solution at step 106. The NiO$_x$:electron acceptor solution is solution-processed onto a substrate to form a NiO$_x$:electron acceptor nanocomposite based film on the substrate at step 108.

By way of example, the substrate is a rigid substrate, such as glass, silicon, Indium tin oxide (ITO) coated glass, fluorine-doped tin oxide (FTO) coated glass, or any of them coated with semiconductor materials. In another example, the substrate is a flexible substrate such as ITO coated polyethylene terephthalate (PET), ITO coated polyethylenenaphthalate (PEN), ITO coated polyimide (PI), FTO coated PET, FTO coated PEN, and FTO coated PI, or any of them coated with semiconductor materials.

In an exemplary embodiment, the work function (WF) of the NiO$_x$:electron acceptor nanocomposite based film is tunable through varying concentrations of the electron acceptor such that it can be aligned with a HOMO energy level or valance band of a plurality of donor layers, such as P3HT, in order to facilitate hole extraction or injection.

By way of example, the electron acceptor as used herein, refers to an organic small molecule with the general chemical formula Fx-TCNQ, wherein x=0, 1, 2, 3, 4 such as one selected from a group consisting of 7,7,8,8-tetracyanoquinodimethane (TCNQ), 2-fluoro-7,7,8,8-tetracyanoquinodimethane (F1-TCNQ), 2,3-difluoro-7,7,8,8-tetracyanoquinodimethane (2,3-F2-TCNQ), 2,5-difluoro-7,7,8,8-tetracyanoquinodimethane (2,5-F2-TCNQ), 2,6-difluoro-7,7,8,8-tetracyanoquinodimethane (2,6-F2-TCNQ), 2,3,5-trifluoro-7,7,8,8-tetracyanoquinodimethane (2,3,5-F3-TCNQ), 2,3,6-difluoro-7,7,8,8-tetracyanoquinodimethane (2,3,6-F3-TCNQ), 2,5,6-difluoro-7,7,8,8-tetracyanoquinodimethane (2,5,6-F3-TCNQ), 3,5,6-difluoro-7,7,8,8-tetracyanoquinodimethane (3,5,6-F3-TCNQ), and 2,3,5,6-tetrafluoro-7,7,8,8-tetracyanoquinodimethane (F4-TCNQ).

By way of example, the alcohol solvent has a general chemical formula of CnH2n+1OH, wherein n is a positive integer, such as methanol (CH3OH), ethanol (C2H5OH), propanol (C3H7OH), and butanol (C4H9OH).

The exemplary methods dispense with a pre-treatment for the substrate as well as a post-treatment of the NiO$_x$:electron acceptor nanocomposite based film. By way of example, the pre-treatment is ultraviolet oxidization (UVO) treatment or oxygen-plasma treatment. The post-treatment is at least one of UVO treatment, oxygen-plasma treatment, and annealing.

FIG. 2 shows X-ray Photoelectron Spectroscopy (XPS) results of synthesized NiO$_x$ in accordance with an exemplary embodiment. The characteristic peaks are fitted by using a Gaussian function. The Ni 2p$_{3/2}$ characteristic peaks of NiO$_x$ films are shown in FIG. 2A. The peak centered at 861.0 eV corresponds to a shake-up process in the cubic rock salt structured NiO. The main peak centered at 854.2 eV is ascribed to the standard Ni—O octahedral bonding configuration. The peaks centered around 855-856 eV are ascribed to Ni$^{2+}$ vacancy-induced Ni$^{3+}$ state. These Ni$^{2+}$ vacancies induce positive charge compensation, and result in the p-type conductivity property of NiO$_x$. Typically, the peak centered at 856.4 eV corresponds to NiOOH species, while the peak centered at 855.5 eV corresponds to Ni$_2$O$_3$ species. By analyzing the integral area in the Ni 2p3/2 spectra, the concentration ratio of NiOOH, Ni$_2$O$_3$, and NiO is determined to be 0.504:0.287:1. The atomic ratio of Ni:O is determined to be 1:1.36 as a result, which deviates from a 1:1 atomic ratio and favors a hole transport property.

Figure 2A:
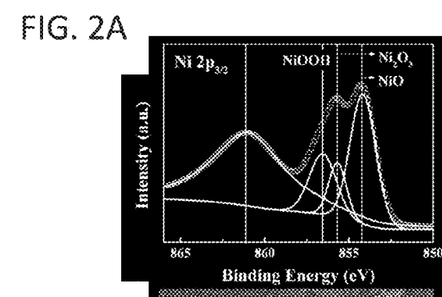
FIG. 2A shows X-ray Photoelectron Spectroscopy (XPS) results of $NiO_x$ films of Ni $2p_{2/3}$ core level peaks in accordance with an exemplary embodiment of the present invention.
Figure 2B:
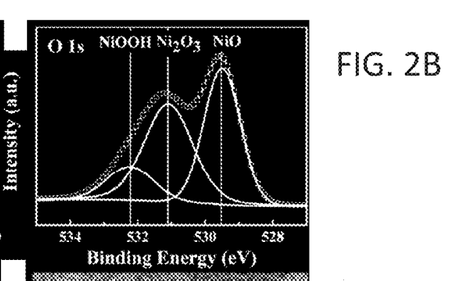
FIG. 2B shows XPS results of $NiO_x$ films of O 1s core level peaks in accordance with an exemplary embodiment of the present invention.

FIG. 2B shows the spectrum of O 1s state in NiO$_x$ films in accordance with an exemplary embodiment. Similarly, the peak at 529.5 eV is indicative of Ni—O octahedral bonding in NiO. The peak at 532.2 eV is ascribed to NiOOH and the peak at 531.1 eV is ascribed to the Ni$_2$O$_3$ species or hydroxyl groups absorbed on the surface. The XPS results clarify the non-stoichiometric property of the resultant NiO$_x$ films. Considering the insulating nature of stoichiometric NiO, the non-stoichiometric composition, determined from the XPS studies, endows the prepared NiO$_x$ film with hole transport ability.

Figure 2C:
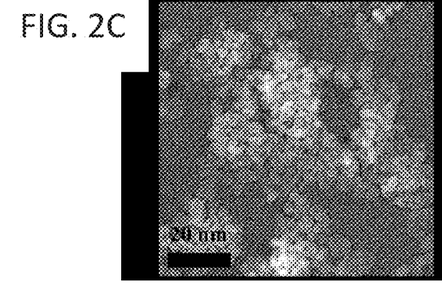
FIG. 2C shows a Transmission Electron Microscopy (TEM) image of $NiO_x$NPs with a scale bar of 20 nm in accordance with an exemplary embodiment of the present invention.
Figure 2D:
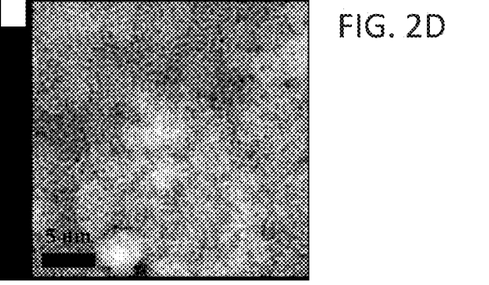
FIG. 2D shows a High-Resolution Transmission Electron Microscopy (HRTEM) image of $NiO_x$ NPs with a scale bar of 5 nm in accordance with an exemplary embodiment of the present invention.
Figure 3:
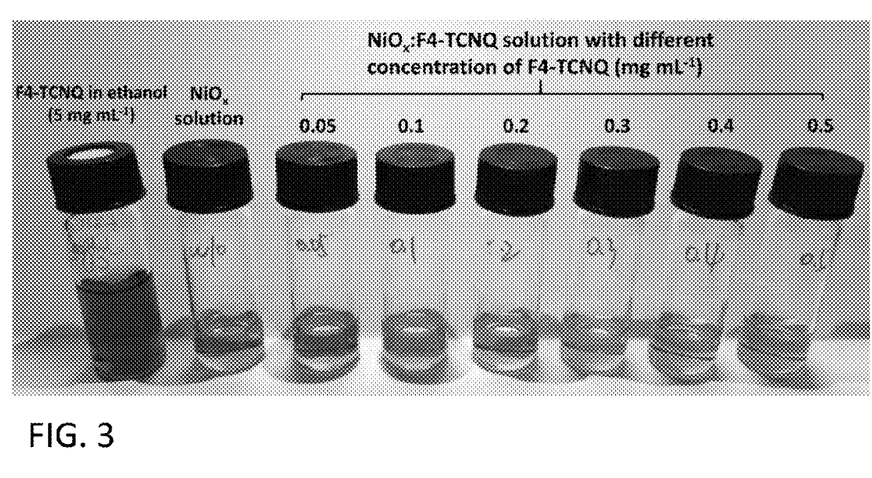
FIG. 3 shows a photograph of F4-TCNQ in ethanol, NiO$_x$ NPs in ethanol and NiO$_x$:F4-TCNQ solutions with different concentrations of F4-TCNQ in accordance with an exemplary embodiment of the present invention.
Figure 4A:
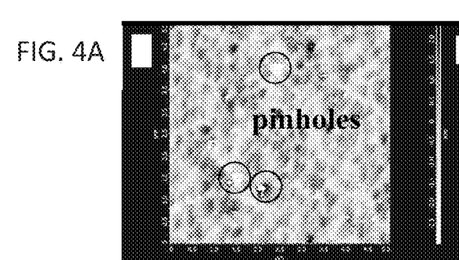
FIG. 4A shows an Atomic-Force Microscopy (AFM) result of a one-step prepared film for a PEDOT:PSS film.
Figure 4B:
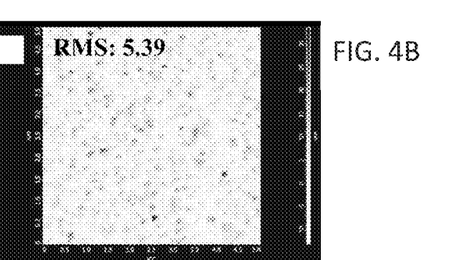
FIG. 4B is for a NiO$_x$ film and FIG. 4C is for a NiO$_x$:F4TCNQ film with a concentration of: 0.05 mg mL$^{-1}$.
Figure 4C:
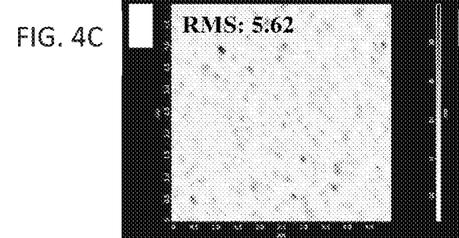
Figure 4D:
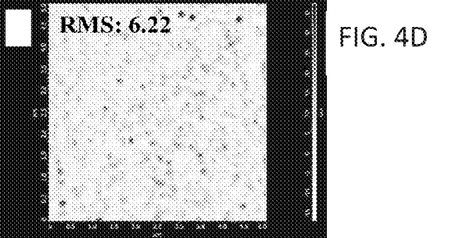
FIG. 4D is for NiO$_x$:F4TCNQ film with a concentration of 0.1 mg mL$^{-1}$.
Figure 4E:
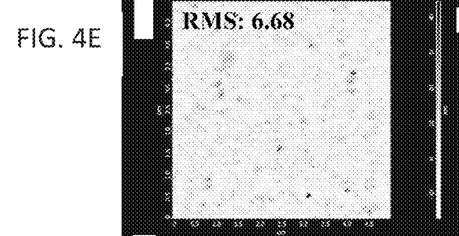
FIG. 4E is for a concentration of 0.2 mg mL$^{-1}$.
Figure 4F:
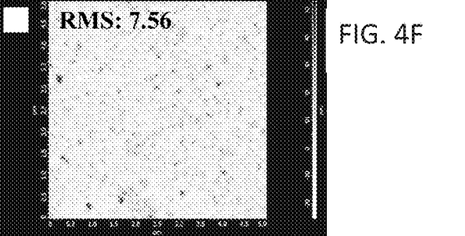
FIG. 4F is for a concentration of 0.3 mg mL$^{-1}$.
Figure 4G:
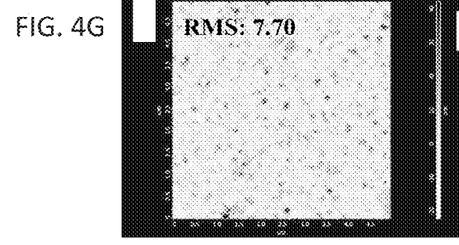
FIG. 4G is for a concentration of 0.4 mg mL$^{-1s}$
Figure 4H:
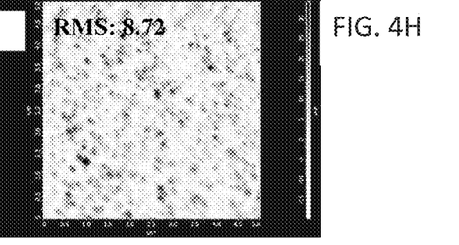
FIG. 4H is for a concentration of 0.5 mg mL$^{-1}$ in accordance with an exemplary embodiment of the invention.

Transmission Electron Microscope (TEM) results of NiO$_x$ NPs are as shown in FIG. 2C and FIG. 2D. The particle size of as-prepared NiO$_x$ is around 4 nm, and shows a good uniformity. X-ray Diffraction (XRD) was also performed to investigate the crystal structure of NiO$_x$ NPs. The synthesized NiO$_x$ NPs in ethanol (5 mg mL$^{-1}$), as shown in FIG. 3, illustrates a clear and stable solution.

The alcohol solvent has a general chemical formula of $C_nH_{2n+1}OH$, where n is a positive integer, preferably selected from methanol (CH$_3$OH), ethanol (C$_2$H$_5$OH), propanol ($C_3H_7OH$), butanol ($C_4H_9OH$). For example, the photograph of F4-TCNQ in ethanol (5 mg mL$^{-1}$) is shown in FIG. 3A. F4-TCNQ can be well dissolved into ethanol as well, which shows promise as the dopant of the ethanol processed NiO$_x$ NPs. By varying the concentration of F4-TCNQ from 0.05 to 0.5 mg mL$^{-1}$ while fixing the concentration of NiO$_x$ at 5 mg mL$^{-1}$, a series of well mixed NiO$_x$:F4-TCNQ solutions are prepared with their photograph shown in FIG. 3.

The one-step prepared NiO$_x$:F4-TCNQ nanocomposite films have been prepared on a substrate without any pre-treatments through, e.g., spin coating, drop casting, spray coating, Mayer rod techniques, and/or doctor blade techniques.

Exemplary embodiments provide a NiO$_x$:electron acceptor nanocomposite based film that is solution-processed onto a substrate. The exemplary film can be applied to an optoelectronic device and acts as a hole transport layer (HTL) to transport holes. By way of example, the optoelectronic device can be a solar cell, a light emitting diode, a laser, or a photodetector.

In an exemplary embodiment, the NiO$_x$:electron acceptor nanocomposite based film is used as a HTL in an optoelectronic device and contributes to high performance for the optoelectronic device. HTLs by using, for example, NiO$_x$:electron acceptor nanocomposite based film, also contribute to simple and low-cost fabrication for practical optoelectronic device production.

Due to the good energy level match between ethanol and most pristine substrates, the NiO$_x$:electron acceptor solution shows good wetting properties on pristine substrates even without any pre-treatments. For example, about 50 μL NiO$_x$:F4-TCNQ solution can fully cover the pristine ITO substrate (1.7×1.7 cm$^2$). As a comparison, 50 μL water-based PEDOT:PSS solution can hardly cover the pristine ITO substrate without any pre-treatments. To fully cover the substrate, 500 μL of water-based PEDOT:PSS solution is needed to prepare the one-step prepared PEDOT:PSS films, which wastes material. The surface morphology comparison between one-step prepared PEDOT:PSS and one-step prepared NiO$_x$:F4-TCNQ films on ITO have also been investigated by microscope characterization and Atomic Force Microscope (AFM) as shown in FIG. 4. Due to the poor wetting properties of water on pristine ITO, the one-step prepared PEDOT:PSS shows non-uniformity and pin-holes. It is noteworthy, that the one-step prepared NiO$_x$:F4-TCNQ film (with a concentration of 0.4 mg mL$^{-1}$ of F4-TCNQ, which is the optimized concentration for device fabrication) shows a uniform and pinhole-free morphology. The root-mean-square (RMS) roughness slightly increases with the increasing of concentrations of F4-TCNQ. Considering the formation of films with good coverage and smoothness is fundamentally critical for the applications of interface materials in devices, the NiO$_x$:F4-TCNQ nanocomposite films show promise as good HTLs for device applications.

Figure 5A:
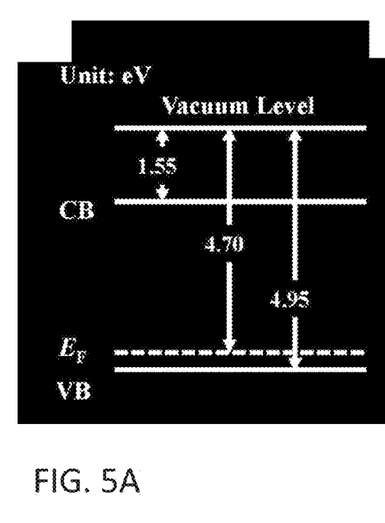
FIG. 5A shows an energy level diagram of NiO$_x$ film in accordance with an exemplary embodiment of the present invention.

Optical and electrical properties of one-step prepared NiO$_x$:F4-TCNQ HTL have been investigated and the results are demonstrated as following. Ultraviolet photoelectron spectroscopy (UPS) and ellipsometer are utilized to investigate the energy band structures of the ethanol processed NiO$_x$ films. The energy level of NiO$_x$ film is determined to be as shown in FIG. 5A. The secondary-electron cut-off ($E_{cut-off}$) at 16.52 eV indicates an effective WF of 4.70 eV. The valence band (VB) is 0.25 eV below the fermi level ($E_F$), indicating a p-type semiconducting property of the prepared NiO$_x$ films. By varying the concentration of a strong electron acceptor, F4-TCNQ, in the NiO$_x$:F4-TCNQ solution, the WF of the one-step prepared NiO$_x$:F4-TCNQ nanocomposite films can be effectively tuned. The WF of NiO$_x$:F4-TCNQ films formed on ITO was determined by Kelvin-Probe measurement. WF of the pristine NiO$_x$ film was determined to be 4.73 eV, which is comparable with the UPS results. When the added F4-TCNQ varies from 0.05 to 0.5 mg mL$^{-1}$, WF increases from 4.79 eV to 5.30 eV continuously. Considering the HOMO values of most donor materials used in OSCs vary from 5.0 eV to 5.5 eV, the NiO$_x$:F4-TCNQ films can serve as potential candidates of HTLs in OSCs.

Figure 5B:
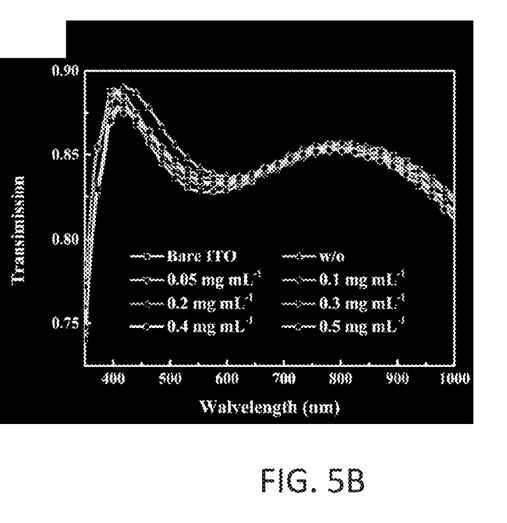
FIG. 5B shows the transmission spectra of indium tin oxide (ITO), ITO/NiO$_x$ and ITO/NiO$_x$:F4-TCNQ in accordance with an exemplary embodiment of the present invention.

Moreover, optical transparency is also an essential characteristic for a good HTL on ITO. FIG. 5 shows the optical transmission spectra of ethanol processed NiO$_x$:F4-TCNQ films (with a thickness around 17 nm) in accordance with an exemplary embodiment. In the visible and near infrared (NIR) range, the NiO$_x$:F4-TCNQ films' transmission is over 83%. At a wavelength between 450-750 nm, which is the main absorption range of most organic donor materials, the NiO$_x$ and NiO$_x$:F4-TCNQ films are more transparent than bare ITO. The results signify that NiO$_x$:F4-TCNQ nanocomposite films are decent HTL candidates in OCSs.

Figure 6A:
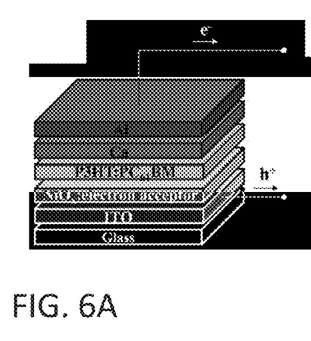
FIG. 6A shows the structure of a solar cell (ITO/NiOx:electron acceptor/P3HT:PC$_{61}$BM/Ca/Al) in accordance with an exemplary embodiment of the present invention.

OSCs according to an exemplary embodiment of the invention can be constructed as illustrated in FIG. 6A. By changing the concentration of F4-TCNQ, device performances can be modified. For P3HT:[6,6]-phenyl-C$_{61}$-butyric acid methyl ester (PC$_{61}$BM) based OSCs, when the as-prepared NiO$_x$ (without F4-TCNQ) is used as the HTL, the PCE is only 0.60%. This can be explained by the low WF of pristine NiO$_x$ and the induced hole injection barrier at the interface. Interestingly, when the concentration of F4-TCNQ increases from 0.05 to 0.4 mg mL$^{-1}$, Jsc, V$_{OC}$, and FF all increase and PCE increases to a best average value of 3.59%. The average PCE shows a 15.8% improvement compared with that of one-step prepared PEDOT:PSS based OSCs, whose average PCE is only 3.10%. In addition, the performance deviation among the fabricated OSCs is remarkably improved, which indicates the one-step prepared NiO$_x$:F4-TCNQ based devices have a better reproducibility.

Figure 6B:
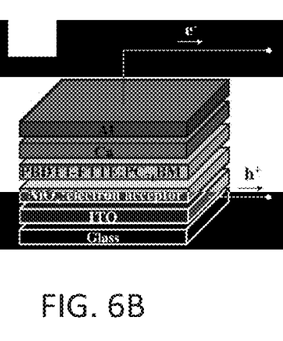
FIG. 6B shows the structure of a solar cell (ITO/NiOx: electron acceptor/PBDTT-FTTE:PC$_{71}$BM/Ca/Al) in accordance with an exemplary embodiment of the present invention.

OSCs according to an exemplary embodiment of the invention can be constructed as illustrated in FIG. 6B. Poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene-)-2-carboxylate-2-6-diyl)] (PBDTT-FTTE) is used as the donor material and [6,6]-phenyl-C$_{71}$-butyric acid methyl ester (PC$_{71}$BM) is used as the acceptor material. The highest efficiency is achieved when the F4-TCNQ concentration is 0.4 mg mL$^{-1}$ with an optimized average PCE of 8.59%. The PCE outperforms that of the optimized OSCs based on one-step processed PEDOT:PSS by an 18.5% improvement. The optimized average PCE of the PEDOT:PSS case is only 7.25% due to the poor FF. Importantly, the deviation among the fabricated OSCs is remarkably improved again. The deviation of the optimized NiO$_x$:F4-TCNQ based devices (at F4-TCNQ concentration of 0.4 mg mL$^{-1}$) is 0.14 while that of the optimized PEDOT:PSS based devices is 0.97. The improvement is as large as about 7 times. While P3HT and PBDTT-FTTE have different HOMO energy levels of 5.00 eV and 5.22 eV, respectively, the results below show that the NiO$_x$:F4-TCNQ of the present invention can serve as an effective HTL in OSCs based on different organic donor materials.

Figure 6C:
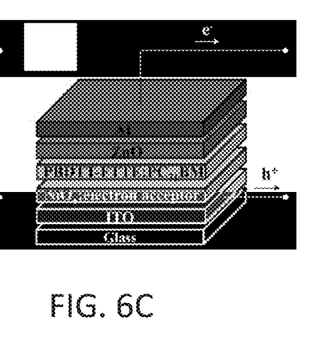
FIG. 6C shows the structure of a solar cell (ITO/NiOx: electron acceptor/PBDTT-FTTE:PC$_{71}$BM/ZnO/Al) in accordance with an exemplary embodiment of the present invention.

Considering that parasitic absorption of Ca will have a negative influence on photocurrent generation, the ZnO has been widely used as a better choice in OSCs due to its optical spacer effect and better stability. In conventional structured OSCs, the introduction of a ZnO layer on an active layer will modify the light distribution inside solar cells and thus optimize the absorption in the active layer. Photocurrent will be enhanced as a result. To realize a better performance, OSCs according to an exemplary embodiment of the invention can be constructed as illustrated in FIG. 6C. The ZnO NPs solution (with a concentration of 16 mg mL$^{-1}$) is spin-coated onto the methanol washed active layer surface without any further treatment. The thickness of ZnO is determined to be 20 nm. After using ZnO as ETL, the $J_{SC}$ of one-step prepared PEDOT:PSS based devices increases from 15.15 mA cm$^{-2}$ to 16.54 mA cm$^{-2}$, and the $J_{SC}$ of NiO$_x$:F4-TCNQ based devices increases from 16.80 mA cm$^{-2}$ to 18.29 mA cm$^{-2}$. Because of the significant enhancement of $J_{SC}$ values, the average PCE increases from 7.25% to 8.06% and from 8.59% to 9.54% for one-step prepared PEDOT:PSS and NiO$_x$:F4-TCNQ based devices, respectively. The performance of NiO$_x$:F4-TCNQ based OSCs outperforms PEDOT:PSS based OSCs by 18.4%. The PCE deviation among the fabricated OSCs improved from 0.72 (one-step prepared PEDOT:PSS based OSCs) to 0.20 (one-step prepared NiO$_x$:F4-TCNQ based OSCs) by 3.6 times.

Following are examples that illustrate procedures for practicing the invention. These examples should not be construed as limiting.

Example 1

The OSCs based on P3HT were fabricated by using the conventional structure of ITO/HTL/Active layer/Ca (20 nm)/Al (100 nm). The device performance of OSCs based on P3HT with different concentrations of F4-TCNQ, are summarized in Table 1.

TABLE 1

Performance summary of OSCs with a structure of ITO/HTL/P3HT:PC$_{61}$BM/Ca/Al.

| | Concentration of F4-TCNQ [mg mL$^{-1}$] | $J_{SC}$ [mA cm$^{-2}$] | $V_{OC}$ [V] | FF | PCE [%] |
|---|---|---|---|---|---|
| P3HT: PC$_{61}$BM | w/o | 7.50 ± 0.44 | 0.34 ± 0.02 | 0.233 ± 0.012 | 0.60 ± 0.06 |
| | 0.05 | 8.99 ± 0.26 | 0.40 ± 0.01 | 0.290 ± 0.013 | 1.05 ± 0.09 |
| | 0.1 | 9.62 ± 0.20 | 0.48 ± 0.01 | 0.395 ± 0.019 | 1.83 ± 0.02 |
| | 0.2 | 9.61 ± 0.19 | 0.57 ± 0.01 | 0.571 ± 0.015 | 3.13 ± 0.04 |
| | 0.3 | 9.79 ± 0.19 | 0.59 ± 0.01 | 0.599 ± 0.009 | 3.46 ± 0.10 |
| | 0.4 | 9.89 ± 0.13 | 0.59 ± 0.01 | 0.616 ± 0.008 | 3.59 ± 0.04 |
| | 0.5 | 9.86 ± 0.11 | 0.59 ± 0.01 | 0.605 ± 0.009 | 3.52 ± 0.09 |
| | PEDOT: PSS[a] | 9.21 ± 0.35 | 0.58 ± 0.02 | 0.582 ± 0.047 | 3.10 ± 0.40 |

[a]One-step prepared PEDOT:PSS HTLs without any pre-treatment of ITO glasses or post-treatment.

Example 2

The OSCs based on different bandgap polymers were fabricated by using the conventional structure of ITO/HTL/Active layer/Ca (20 nm)/Al (100 nm). The control OSCs were also fabricated by using a one-step prepared PEDOT:PSS layer for comparison. The device performance of OSCs based on different NiO$_x$:F4-TCNQ HTLs are summarized in Table 2.

TABLE 2

Performance summary of OSCs with a structure of ITO/HTL/PBDTT-FTTE:PC$_{71}$BM/Ca/Al.

| | Concentration of F4-TCNQ [mg mL$^{-1}$] | $J_{SC}$ [mA cm-2] | $V_{OC}$ [V] | FF | PCE [%] |
|---|---|---|---|---|---|
| PBDTT-FTTE: PC$_{71}$BM | w/o | 16.43 ± 0.35 | 0.51 ± 0.01 | 0.454± 0.002 | 3.84 ± 0.11 |
| | 0.05 | 16.27 ± 0.21 | 0.60 ± 0.01 | 0.539 ± 0.008 | 5.29 ± 0.06 |
| | 0.1 | 16.40 ± 0.44 | 0.68 ± 0.01 | 0.571 ± 0.006 | 6.34 ± 0.19 |
| | 0.2 | 16.73 ± 0.18 | 0.74 ± 0.02 | 0.608 ± 0.006 | 7.48 ± 0.27 |
| | 0.3 | 16.78 ± 0.12 | 0.77 ± 0.01 | 0.623 ± 0.011 | 8.04 ± 0.22 |
| | 0.4 | 16.80 ± 0.23 | 0.78 ± 0.01 | 0.623 ± 0.010 | 8.59 ± 0.14 |
| | 0.5 | 16.60 ± 0.33 | 0.78 ± 0.01 | 0.644 ± 0.009 | 8.32 ± 0.11 |
| | PEDOT: PSS[a] | 15.15 ± 0.21 | 0.79 ± 0.00 | 0.606 ± 0.079 | 7.25 ± 0.97 |

[a]One-step prepared PEDOT:PSS HTLs without any pre-treatment of ITO glasses or post-treatment.

Example 3

The OSCs based on different bandgap polymers were fabricated by using the conventional structure of ITO/HTL/Active layer/ZnO (20 nm)/Al (100 nm). The control OSCs were also fabricated by using a one-step prepared PEDOT:PSS layer for comparison. The device performance of OSCs based on different bandgap polymers with PC$_{71}$BM are summarized in Table 2.

TABLE 3

Performance summary of the OSC devices (ITO/HTL/PBDTT-FTTE:PC$_{71}$BM/ZnO/Al) based on PEDOT:PSS and NiO$_x$:F4-TCNQ.

| HTL | $J_{sc}$ [mA cm$^{-2}$] | $V_{OC}$ [V] | FF | PCE (PCE$_{max}$) [%] |
|---|---|---|---|---|
| PEDOT: PSS[a] | 16.54 ± 0.27 | 0.77 ± 0.02 | 0.630 ± 0.079 | 8.06 ± 0.72 (9.25) |
| NiO$_x$F4-TCNQ[b] | 18.29 ± 0.19 | 0.79 ± 0.01 | 0.660 ± 0.010 | 9.54 ± 0.20 (9.75) |

[a]The PEDOT:PSS is one-step prepared without any pre- or post-treatment.
[b]The concentration of F4-TCNQ in NiO$_x$ is 0.4 mg mL$^{-1}$.

It should be understood that the examples and embodiments described herein are for illustrative purposes only and that various modifications or changes in light thereof will be suggested to persons skilled in the art and are to be included within the spirit and purview of this application and the scope of the appended claims. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto. Further, the various embodiments presented herein are for illustrative purposes and the present invention is limited solely by the appended claims.

What is claimed is:
1. A method for preparing a NiO$_x$:electron acceptor nanocomposite based film, comprising the steps of:
  synthesizing NiO$_x$ nanoparticles (NPs) by a solvothermal synthesis method;
  dispersing the NiO$_x$ NPs and an electron acceptor into an alcohol solvent to form a NiO$_x$:electron acceptor solution;

conducting an ultrasonic treatment on the $NiO_x$:electron acceptor solution; and solution-processing the $NiO_x$:electron acceptor solution onto a substrate to form a $NiO_x$:electron acceptor nanocomposite based film on the substrate.

2. The method of claim 1, wherein the $NiO_x$ is a composite consisting essentially of NiO and other species selected from nickelic oxide ($Ni_2O_3$), nickel oxide hydroxide (NiOOH), and nickel hydroxide $Ni(OH)_2$.

3. The method of claim 1, wherein the electron acceptor has a general chemical formula of $F_x$-TCNQ, wherein x=0, 1, 2, 3, 4.

4. The method of claim 1, wherein the electron acceptor is selected from a group consisting of 7,7,8,8-tetracyanoquinodimethane (TCNQ), 2-fluoro-7,7,8,8-tetracyanoquinodimethane (F1-TCNQ), 2,3-difluoro-7,7,8,8-tetracyanoquinodimethane (2,3-F2-TCNQ), 2,5-difluoro-7,7,8,8-tetracyanoquinodimethane (2,5-F2-TCNQ), 2,6-difluoro-7,7,8,8-tetracyanoquinodimethane (2,6-F2-TCNQ), 2,3,5-trifluoro-7,7,8,8-tetracyanoquinodimethane (2,3,5-F3-TCNQ), 2,3,6-difluoro-7,7,8,8-tetracyanoquinodimethane (2,3,6-F3-TCNQ), 2,5,6-difluoro-7,7,8,8-tetracyanoquinodimethane (2,5,6-F3-TCNQ), 3,5,6-difluoro-7,7,8,8-tetracyanoquinodimethane (3,5,6-F3-TCNQ), and 2,3,5,6-tetrafluoro-7,7,8,8-tetracyanoquinodimethane (F4-TCNQ).

5. The method of claim 1, wherein the alcohol solvent has a general chemical formula of $C_nH_{2n+1}OH$, wherein n is a positive integer.

6. The method of claim 1, wherein the alcohol solvent is selected from a group consisting of methanol ($CH_3OH$), ethanol ($C_2H_5OH$), propanol ($C_3H_7OH$), and butanol ($C_4H_9OH$).

7. The method of claim 1, wherein the substrate is glass, silicon, Indium tin oxide (ITO) coated glass, fluorine-doped tin oxide (FTO) coated glass, or any of them coated with semiconductor materials.

8. The method of claim 1, wherein the substrate is ITO coated polyethylene terephthalate (PET), ITO coated polyethylene-naphthalate (PEN), ITO coated polyimide (PI), FTO coated PET, FTO coated PEN, and FTO coated PI, or any of them coated with semiconductor materials.

9. The method of claim 1, wherein the film is solution-processed onto the substrate without a pre-treatment of the substrate and without a post-treatment of the film, wherein the pre-treatment is ultraviolet-ozone (UVO) treatment or oxygen-plasma treatment, and wherein the post-treatment is UVO treatment, oxygen-plasma treatment, or annealing.

10. The method of claim 1, wherein the solution-processing is one of casting spin-coating, doctor blading, ink jet printing, spray coating and roll-to-roll coating.

11. The method of claim 1, wherein the concentration of the electron acceptor is changed such that the work function of $NiO_x$:electron acceptor based film is tuned.

* * * * *